United States Patent
Sanga et al.

(10) Patent No.: US 9,518,718 B2
(45) Date of Patent: Dec. 13, 2016

(54) BANDPASS FILTER FOR USE IN LIGHT EMITTING DEVICE AND LIGHT EMITTING DEVICE USING THE SAME

(71) Applicant: NICHIA CORPORATION, Anan-shi (JP)

(72) Inventors: Daisuke Sanga, Tokushima (JP); Tomonori Morizumi, Anan (JP); Naoki Azuma, Katsuura-gun (JP); Keisuke Sejiki, Tokushima (JP); Kunihito Sugimoto, Anan (JP)

(73) Assignee: NICHIA CORPORATION, Anan-Shi (JP)

( * ) Notice: Subject to any disclaimer, the term of this patent is extended or adjusted under 35 U.S.C. 154(b) by 370 days.

(21) Appl. No.: 14/140,379

(22) Filed: Dec. 24, 2013

(65) Prior Publication Data

US 2014/0185299 A1    Jul. 3, 2014

(30) Foreign Application Priority Data

Dec. 28, 2012 (JP) .............. P2012-287722

(51) Int. Cl.
| | |
|---|---|
| *F21V 9/08* | (2006.01) |
| *H01L 25/075* | (2006.01) |
| *H01L 33/58* | (2010.01) |
| *G02B 5/28* | (2006.01) |
| *H01L 33/50* | (2010.01) |

(52) U.S. Cl.
CPC .............. *F21V 9/08* (2013.01); *G02B 5/285* (2013.01); *H01L 25/0753* (2013.01); *H01L 33/58* (2013.01); *H01L 33/50* (2013.01); *H01L 2224/16225* (2013.01)

(58) Field of Classification Search
CPC ........ F21V 9/08; G02B 5/285; H01L 25/0753; H01L 33/58; H01L 2224/16225; H01L 33/50
See application file for complete search history.

(56) References Cited

U.S. PATENT DOCUMENTS

2011/0001157 A1* 1/2011 McKenzie ............ H01L 33/507
                                                                257/98
2011/0198644 A1    8/2011 Hwang et al.

FOREIGN PATENT DOCUMENTS

| JP | 2008-270707 A | 11/2008 |
| JP | 2010-108965 A | 5/2010 |
| JP | 2011-171740 A | 9/2011 |

* cited by examiner

*Primary Examiner* — Stephen F Husar
*Assistant Examiner* — Danielle Allen
(74) *Attorney, Agent, or Firm* — Foley & Lardner LLP

(57) ABSTRACT

Provided is a bandpass filter for a light emitting device that can improve the light emission efficiency in use for a light emitting device, and a light emitting device that can obtain the high light emission efficiency by using the bandpass filter. The light emitting device includes a substrate; a light emitting element disposed over the substrate; a phosphor-containing layer containing at least one kind of phosphor; and a bandpass filter disposed over a surface of the phosphor-containing layer on the light emitting element side, the bandpass filter including a multilayer film having a plurality of first and second dielectric layers, the second dielectric layer being disposed over the first dielectric layer. The bandpass filter has a transmittance of 60% or more for light having a light emission peak wavelength of the light emitting element at an incident angle of 0 to 85°, and another transmittance of 40% or less for light having a light emission peak wavelength of at least one kind of phosphor at an incident angle of a Brewster's angle $(\theta_b)+5°$ $(\theta_b+5°)$ to 85° of the bandpass filter.

21 Claims, 11 Drawing Sheets

Fig. 10

| | | Film thickness [nm] |
|---|---|---|
| 1 | $SiO_2$ | 316.3 |
| 2 | $Nb_2O_5$ | 99.5 |
| 3 | $SiO_2$ | 166.2 |
| 4 | $Nb_2O_5$ | 99.6 |
| 5 | $SiO_2$ | 197.6 |
| 6 | $Nb_2O_5$ | 103.8 |
| 7 | $SiO_2$ | 69.2 |
| 8 | $Nb_2O_5$ | 107.1 |
| 9 | $SiO_2$ | 72.9 |
| 10 | $Nb_2O_5$ | 107.9 |
| 11 | $SiO_2$ | 68.6 |
| 12 | $Nb_2O_5$ | 109.1 |
| 13 | $SiO_2$ | 65.7 |
| 14 | $Nb_2O_5$ | 110.5 |
| 15 | $SiO_2$ | 55.7 |
| 16 | $Nb_2O_5$ | 109.9 |
| 17 | $SiO_2$ | 52.7 |
| 18 | $Nb_2O_5$ | 110.2 |
| 19 | $SiO_2$ | 51.5 |
| 20 | $Nb_2O_5$ | 109.6 |
| 21 | $SiO_2$ | 61.9 |
| 22 | $Nb_2O_5$ | 110.4 |
| 23 | $SiO_2$ | 62.3 |
| 24 | $Nb_2O_5$ | 108.6 |
| 25 | $SiO_2$ | 71.0 |
| 26 | $Nb_2O_5$ | 108.2 |
| 27 | $SiO_2$ | 53.3 |
| 28 | $Nb_2O_5$ | 105.2 |
| 29 | $SiO_2$ | 167.3 |
| 30 | $Nb_2O_5$ | 105.4 |

| | | Film thickness [nm] |
|---|---|---|
| 31 | $SiO_2$ | 53.0 |
| 32 | $Nb_2O_5$ | 106.8 |
| 33 | $SiO_2$ | 82.0 |
| 34 | $Nb_2O_5$ | 107.3 |
| 35 | $SiO_2$ | 67.6 |
| 36 | $Nb_2O_5$ | 108.1 |
| 37 | $SiO_2$ | 78.8 |
| 38 | $Nb_2O_5$ | 107.3 |
| 39 | $SiO_2$ | 70.2 |
| 40 | $Nb_2O_5$ | 106.7 |
| 41 | $SiO_2$ | 75.3 |
| 42 | $Nb_2O_5$ | 105.9 |
| 43 | $SiO_2$ | 61.5 |
| 44 | $Nb_2O_5$ | 103.7 |
| 45 | $SiO_2$ | 211.1 |
| 46 | $Nb_2O_5$ | 103.2 |
| 47 | $SiO_2$ | 60.4 |
| 48 | $Nb_2O_5$ | 105.1 |
| 49 | $SiO_2$ | 61.9 |
| 50 | $Nb_2O_5$ | 103.7 |
| 51 | $SiO_2$ | 212.4 |
| 52 | $Nb_2O_5$ | 106.4 |
| 53 | $SiO_2$ | 51.1 |
| 54 | $Nb_2O_5$ | 109.3 |
| 55 | $SiO_2$ | 50.0 |
| 56 | $Nb_2O_5$ | 108.8 |
| 57 | $SiO_2$ | 43.4 |
| 58 | $Nb_2O_5$ | 104.7 |
| 59 | $SiO_2$ | 176.8 |

Fig. 11

| | | Film thickness [nm] |
|---|---|---|
| 1 | $SiO_2$ | 236.9 |
| 2 | $Nb_2O_5$ | 101.9 |
| 3 | $SiO_2$ | 188.6 |
| 4 | $Nb_2O_5$ | 17.4 |
| 5 | $SiO_2$ | 181.6 |
| 6 | $Nb_2O_5$ | 98.4 |
| 7 | $SiO_2$ | 156.1 |
| 8 | $Nb_2O_5$ | 83.4 |
| 9 | $SiO_2$ | 140.1 |
| 10 | $Nb_2O_5$ | 66.4 |
| 11 | $SiO_2$ | 144.1 |
| 12 | $Nb_2O_5$ | 52.9 |
| 13 | $SiO_2$ | 169.0 |
| 14 | $Nb_2O_5$ | 27.0 |
| 15 | $SiO_2$ | 183.7 |
| 16 | $Nb_2O_5$ | 90.8 |
| 17 | $SiO_2$ | 126.2 |
| 18 | $Nb_2O_5$ | 77.7 |
| 19 | $SiO_2$ | 195.9 |
| 20 | $Nb_2O_5$ | 8.6 |
| 21 | $SiO_2$ | 201.2 |
| 22 | $Nb_2O_5$ | 69.2 |
| 23 | $SiO_2$ | 157.2 |
| 24 | $Nb_2O_5$ | 22.7 |
| 25 | $SiO_2$ | 78.6 |
| 26 | $Nb_2O_5$ | 88.5 |
| 27 | $SiO_2$ | 80.5 |
| 28 | $Nb_2O_5$ | 80.9 |
| 29 | $SiO_2$ | 71.2 |
| 30 | $Nb_2O_5$ | 86.6 |

| | | Film thickness [nm] |
|---|---|---|
| 31 | $SiO_2$ | 68.8 |
| 32 | $Nb_2O_5$ | 76.6 |
| 33 | $SiO_2$ | 137.9 |
| 34 | $Nb_2O_5$ | 22.0 |
| 35 | $SiO_2$ | 154.4 |
| 36 | $Nb_2O_5$ | 89.4 |
| 37 | $SiO_2$ | 150.8 |
| 38 | $Nb_2O_5$ | 52.5 |
| 39 | $SiO_2$ | 8.8 |
| 40 | $Nb_2O_5$ | 30.9 |
| 41 | $SiO_2$ | 187.0 |
| 42 | $Nb_2O_5$ | 103.0 |
| 43 | $SiO_2$ | 209.6 |
| 44 | $Nb_2O_5$ | 17.5 |
| 45 | $SiO_2$ | 178.1 |
| 46 | $Nb_2O_5$ | 57.3 |
| 47 | $SiO_2$ | 134.3 |
| 48 | $Nb_2O_5$ | 70.6 |
| 49 | $SiO_2$ | 144.7 |

BANDPASS FILTER FOR USE IN LIGHT EMITTING DEVICE AND LIGHT EMITTING DEVICE USING THE SAME

BACKGROUND OF THE INVENTION

Field of the Invention the disclosure relates to bandpass filters for use in light emitting devices, and more specifically, to a bandpass filter for use in a light emitting device including a light emitting element and a phosphor-containing layer containing a phosphor for emitting light by being excited by light from the light emitting element, and a light emitting device using the bandpass filter.

Description of Related Art

Light emitting devices using a light emitting element, such as a light emitting diode (LED) or a laser diode (LD), are generally known to be small in size with a good light emitting efficiency (power efficiency) and to emit vivid-colored light.

A spectrum of light emitted from such a light emitting element generally has its peak in the narrow wavelength range of the spectrum. In contrast, for example, light emitting devices used for applications emphasizing visibility of color, including an illumination equipment, a display, and the like are required to emit light with high color rendering properties, for example, to emit light having a relatively wide spectrum, such as white light.

Thus, most of the light emitting devices with the light emitting element and used for these applications include a phosphor-containing layer containing one or more kinds of phosphors selected from, for example, a green phosphor, a yellow phosphor and a red phosphor. Then, the phosphor absorbs the light emitted from the light emitting element, and converts the absorbed light into another light with a different wavelength (in a different color). As a result, the light emitted from the light emitting element and passing through the phosphor-containing layer without being absorbed in the phosphor is mixed with the light converted by the phosphor and discharged from the phosphor-containing layer, thereby producing light with a wide range of spectrum.

However, the provision of the phosphor-containing layer allows a part of the light emitted from the light emitting element to reflect from the surface of the phosphor-containing layer without entering the phosphor-containing layer, so that the part of the light does not contribute to the brightness of the light emitted from the light emitting device toward the outside. This leads to the reduction in efficiency of the light emitting device.

Further, a part of light emitted by the phosphor is discharged from one surface of the phosphor-containing layer opposite to the light emitting surface thereof, that is, from the light emitting element side surface, so that the part of the light does not also contribute to the brightness of the light emitted from the light emitting device toward the outside. This also leads to the reduction in efficiency of the light emitting device.

In order to prevent the reduction in efficiency of the light emitting device, a method is proposed which involves forming a bandpass filter on a surface of the phosphor-containing layer on a light emitting element side (or a surface opposite to the light emitting element) to allow the light in a specific wavelength range to preferentially pass through the phosphor-containing layer, as disclosed in JP 2010-108965 A.

The bandpass filter is a multilayer film composed of at least two kinds of dielectric layers. The bandpass filter has a high transmittance (that is, a low reflectivity) for the light emitted from the light emitting element, and a low transmittance (that is, a high reflectivity) for the light emitted from the phosphor excited by the light from the light emitting element.

The amount of light reflected from the surface of the bandpass filter of the light emitted from the light emitting element is smaller than that of light reflected from the surface of the phosphor-containing layer without using the bandpass filter. Most of the light entering into the bandpass filter can enter the phosphor-containing layer as it is. Thus, most of the light emitted from the light emitting element can be guided to the phosphor-containing layer.

Further, most of light emitted from the surface on the light emitting element side of the phosphor-containing layer in the lights excited by the phosphor is reflected from the surface of the bandpass filter to return to the inside of the phosphor-containing layer.

As a result, the light emitting device with the bandpass filter can obtain the high light emission efficiency.

In many applications using the light emitting device, including an illuminating device, a display device, or the like, the reduction in used energy (energy saving) and in size and weight of the device are requested more than ever before. Also, the light emitting device is also required to have further improved light emission efficiency.

SUMMARY OF THE INVENTION

The invention has been made so as to meet the foregoing requirements, and it is an object of the invention to provide a bandpass filter for a light emitting device that can further increase the light emission efficiency in use for a light emitting device, and a light emitting device that can obtain the high light emission efficiency by using the bandpass filter.

According to an embodiment of the invention, the light emitting device is provided which includes a substrate; a light emitting element disposed over the substrate; a phosphor-containing layer containing at least one kind of phosphor; and a bandpass filter disposed over a surface of the phosphor-containing layer on the light emitting element side, the bandpass filter including a multilayer film having a plurality of first and second dielectric layers, the second dielectric layer being disposed over the first dielectric layer. The bandpass filter has a transmittance of 60% or more for light having a light emission peak wavelength of the light emitting element at an incident angle of 0 to 85°, and another transmittance of 40% or less for light having a light emission peak wavelength of the at least one type of phosphor for at an incident angle of a Brewster's angle ($\theta_b$) of the bandpass filter+5° ($\theta_b$+5°) to 85°.

According to another embodiment of the invention, a bandpass filter for use in a light emitting device including a light emitting element and a phosphor is provided which includes a multilayer film with a plurality of first and second dielectric layers, the second dielectric layer being disposed over the first dielectric layer. The bandpass filter has a transmittance of 60% or more at an incident angle of 0 to 85° at any wavelength of 420 to 460 nm, and another transmittance of 40% or less in a range of a Brewster's angle of +5° to 85° at any wavelength of 520 to 580 nm.

The light emitting device using the bandpass filter for the light emitting device according to the present invention can obtain the higher light emission efficiency.

BRIEF DESCRIPTION OF THE DRAWINGS

FIG. 10 is a table showing the thickness of each layer of the bandpass filter in the invention of the present application based on the result of calculation shown in FIG. 4A.

FIG. 11 is a table showing the thickness of each layer of the conventional bandpass filter based on the result of calculation shown in FIG. 7.

FIG. 12B is a diagram of the reflectivities of the bandpass filter 10 shown in FIG. 4A in the cases of the P polarization and S polarization, and shows the reflectivity of the S polarization.

DETAILED DESCRIPTION OF THE EMBODIMENTS

Figure 1:
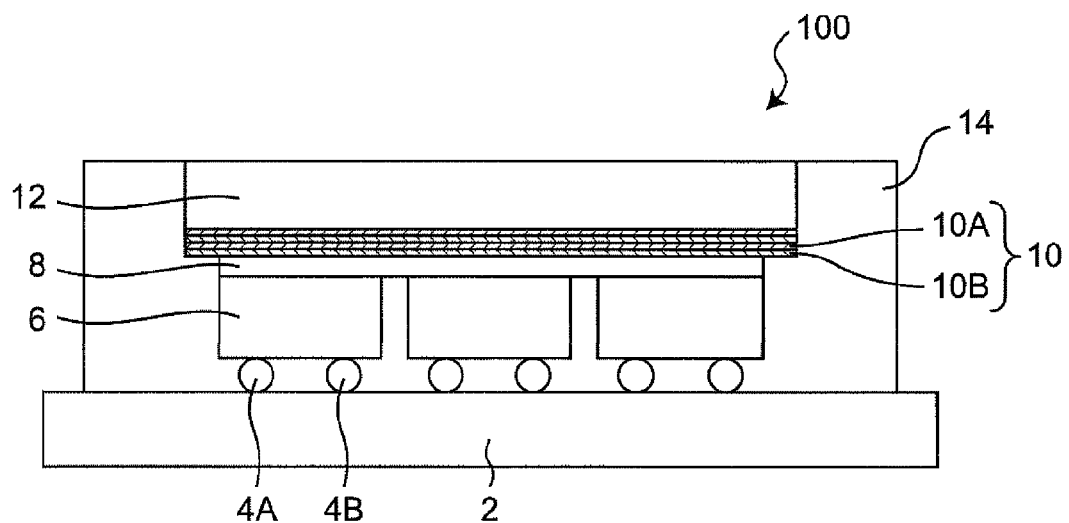
FIG. 1 is a schematic cross-sectional view showing a light emitting device 100 using a bandpass filter 10 according to the present invention.

Preferred embodiments of the invention will be described in detail below based on the accompanying drawings. In the description below, if necessary, the terms indicative of the specific direction or position (for example, "upper", "lower", "right", "left", and other words including these words) are used for easy understanding of the invention with reference to the drawings. The meanings of the terms do not limit the technical range of the invention. The same parts or members are designated by the same reference numerals throughout the drawings.

(1) Outline of Light Emitting Device 100

FIG. 1 shows a schematic cross-sectional view of a light emitting device 100 using a bandpass filter 10 according to the invention of the present application.

The light emitting device 100 exemplifies the light emitting device structure using the bandpass filter according to the present invention. Thus, the structure of the bandpass filter and light emitting device according the invention is not limited to the structure shown in FIG. 1, but may have any structure satisfying the technical features of the invention defined by claims.

In the light emitting device 100, for example, a light emitting element 6, including a light emitting diode, such as a blue LED, is disposed over a substrate 2. More specifically, a wiring (or circuit) (not shown) is formed of, for example, a metal film over an upper surface of the substrate 2. The wiring is electrically connected to electrodes 4A and 4B of the light emitting element (for example, the electrode 4A being a positive electrode, and the electrode 4B being a negative electrode). With this arrangement, a light emitting element 6 can emit light.

The bandpass filter 10 is arranged over the light emitting element 6 via a contact layer 8 that is provided optionally.

In this embodiment shown in FIG. 1, a plurality of the light emitting elements 6 are arranged, and one bandpass filter 10 is arranged to cover all the light emitting elements 6.

However, the invention is not limited to this embodiment, and for example, one light emitting element 6 may be provided. Alternatively, the light emitting elements 6 and a plurality of bandpass filters 10 covering one or more light emitting elements (not all light emitting elements 6, but parts thereof (for example, three out of twelve light emitting elements 6)) may be arranged.

A phosphor-containing layer 12 is arranged on the bandpass filter 10 to come into contact with the bandpass filter 10.

The phosphor-containing layer 12 contains a phosphor material, for example, one or more kinds of phosphor elements selected from the group consisting of a green phosphor, a yellow phosphor, and a red phosphor as will be described later.

The upper surface of the bandpass filter 10 is preferably in intimate contact with the lower surface of the phosphor-containing layer 12 (e.g. without space therebetween) across the entire interface therebetween without any clearance. The light emitted upward from the light emitting element as shown in FIG. 1 can surely enter the phosphor-containing layer 12 through the bandpass filter 10. Then, the phosphor of the phosphor-containing layer 12 absorbs the light from the light emitting element (that is, excited by the light from the light emitting element). The light reflected at an upper surface of the bandpass filter 10 among the emitted lights having a long wavelength (having its wavelength converted) can surely enter the phosphor-containing layer 12.

The light emitting device 100 may have a resin package 14 enclosing the side surfaces of the light emitting element 6, bandpass filter 10, and phosphor-containing layer 12, if necessary. In use of the resin package 14, the resin package 14 can be formed of various kinds of resins. In particular, the resin package 14 is preferably formed of a light-reflective resin that reflects the light from the light emitting element 6 and the light having its wavelength converted by the phosphor-containing layer 12.

(2) Bandpass Filter 10

The details of the bandpass filter 10 of the invention will be described below.

The bandpass filter 10 is a multilayer film including two or more kinds of dielectric layers stacked on each other. In the embodiment shown in FIG. 1, the bandpass filter 10 is formed of a laminated structure with alternating a first dielectric layer 10A and a second dielectric layer 10B. The second dielectric layer 10B is formed of a different dielectric material (second dielectric material) from material forming the first dielectric layer 10A (first dielectric material). For easy understanding of the structure, FIG. 1 shows two first dielectric layers 10A and two second dielectric layers 10B, that is, four dielectric layers in total. The invention, however, is not limited thereto. Alternatively, an arbitrary number of the first and second dielectric layers 10A and 10B may be stacked on each other. For example, ten or more first dielectric layers 10A and ten or more second dielectric layers 10B are alternatively stacked (in twenty or more layers in total) on each other.

The structure of the bandpass filter 10 is not limited to the embodiment described in FIG. 1, and may have any form of a multilayer film, as long two or more the first dielectric layers 10A and two or more the second dielectric layers 10B disposed over the first dielectric layer 10A are included. For example, the first dielectric layer 10A, the second dielectric layer 10B, and a third dielectric layer formed of a dielectric material (third dielectric material) different from the first and second dielectric materials are repeatedly stacked in turn to form the multilayer film.

The bandpass filter 10 has a transmittance of 60% or more at an incident angle of 0 to 85° for the light having a light emitting peak wavelength of the light emitting element 6 (that is, light having the same wavelength as the peak wavelength of the light emitting spectrum of the light emitting element).

Further, the bandpass filter 10 has a transmittance of 40% or less at a Brewster's angle of +5 to 85° as an incident angle with respect to a light (light having the same wavelength as the peak wavelength of the light emitting spectrum of the phosphor) having a light emitting peak of the phosphor included in the phosphor-containing layer 12 (at least one kind of phosphor among a plurality of kinds of phosphors included in the phosphor-containing layer 12).

The conventional bandpass filter used in the light emitting device uses a transmittance at an incident angle of 0° in setting the transmittance. That is, for example, as shown in FIG. 1 of JP 2010-108965 A, the relationship between the wavelength and the transmittance is obtained using light at an incident angle of 0° (that is, light incident on the surface of the bandpass filter in the vertical direction). Based on the relationship, in the conventional bandpass filter, for example, a transmittance of light at the light emitting peak wavelength of the light emitting element, such as a blue LED, is set to about 90% or more, and transmittance of light at the light emitting peak wavelength of the phosphor is set close to 0% (for example, 5% or less).

The inventors of the present application, however, have been dedicated to studying and finding that the use of a bandpass filter having its transmittance defined in a wide range of incident angle including 0° can improve the light emission efficiency of the light emitting device as mentioned above.

Now, the details of the bandpass filter of the invention will be described below.

In the description below, for easy understanding, specifically, the blue LED is used as the light emitting element 6, and one of yellow phosphors, for example, Yttrium Aluminum Garnet laser (YAG phosphor) is used as the phosphor included in the phosphor-containing layer 12 by way of example. In general, the blue LED has a light emitting peak wavelength in 420 to 460 nm, and the YAG phosphor has a light emitting peak wavelength of 520 to 580 nm.

These examples do not restrict the kinds of the light emitting element 6 and the phosphor contained in the phosphor-containing layer 12 in the invention.

Figure 2:
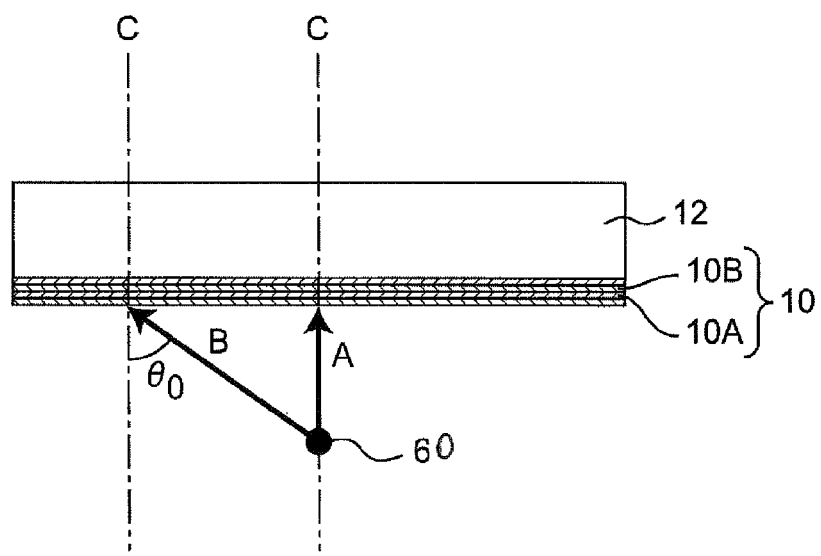
FIG. 2 is an exemplary diagram for explaining an incident angle of the light of a light emitting element 6 entering the bandpass filter 10.

FIG. 2 shows an exemplary diagram for explaining an incident angle of the light from the light emitting element 6 entering the bandpass filter 10.

The incident angle of the light incident on the bandpass filter 10 means an angle formed by the incident light and a normal line C perpendicular to the surface (incident side surface) of the bandpass filter 10.

Referring to FIG. 2, the light emitted from a point 60 on the light emitting element 6 expands in various directions. The arrow A indicates the direction parallel to the normal line C of the bandpass filter 10, that is, indicates the light incident on the bandpass filter at an incident angle of 0°. The arrow B indicates the light incident on the bandpass filter at an angle $\theta_0$ with respect to the normal line C of the bandpass filter 10, that is, at an incident angle of $\theta_0$ (°).

The light emitted from the point 60 on the light emitting element 6 expands in various directions. The incident angle $\theta_0$ of the light entering the bandpass filter 10 from the light emitting element 6 (point 60) is in a range of 0 to 90°. That is, as indicated by the arrow A shown in FIG. 2, the light entering the bandpass filter 10 at an incident angle of 0° is only a part of the light entering the bandpass filter 10 from the light emitting element 6. Even though the lights with the same wavelength are incident on the surface of the same material, the transmittance of the light varies depending on the incident angle of the light.

This corresponds to the light emission (of light whose wavelength is converted) induced by the phosphor of the phosphor-containing layer 12, but can be applied to light reaching the upper surface (light emission side surface) of the bandpass filter 10.

The light emitted from the phosphor generally expands uniformly in various directions without having the directivity, so that the ratio of light having a high incident angle to all the incident lights tends to become relatively high.

Figure 3:
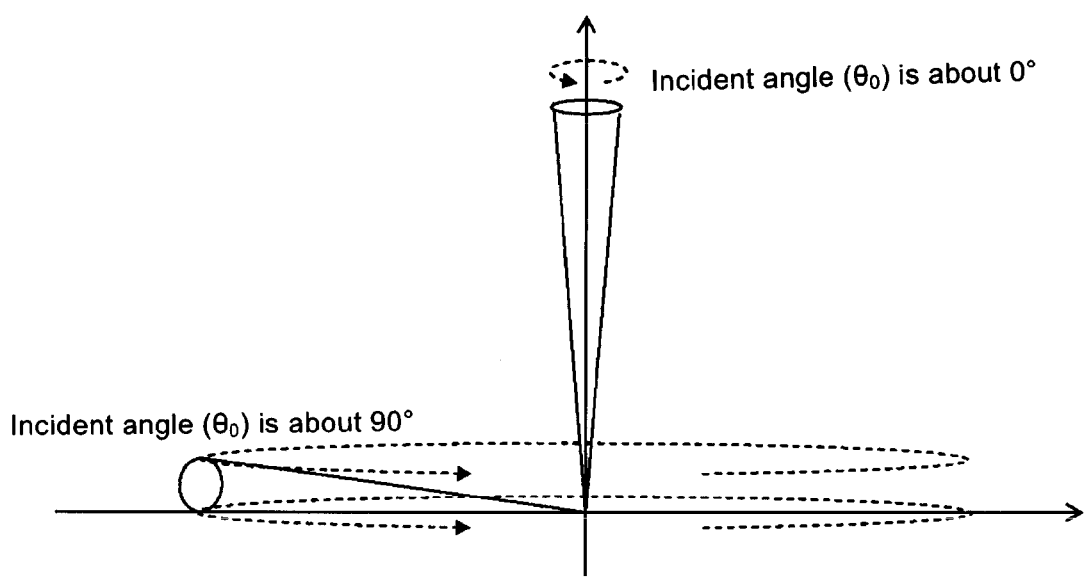
FIG. 3 is an exemplary diagram showing a region at an incident angle of about 0°, and another region at an incident angle of about 90° as the solid angle.

FIG. 3 shows an exemplary diagram of a region corresponding to an incident angle of about 0°, and another region corresponding to an incident angle of about 90° as the solid angle. As can be seen from FIG. 3, as the incident angle becomes larger, the region corresponding to the angle is expanded. Thus, when the distribution of the phosphor becomes relatively uniform and the light from the phosphor has no directivity, it is found that the amount of light from the region corresponding to a larger incident angle is larger than that of light from the region corresponding to a smaller incident angle.

The inventors of the present application pay attention to the above points, and thus have made the bandpass filter according to the present invention.

In other words, the bandpass filter is configured to allow the light from the light emitting element to sufficiently pass therethrough. In this case, when the bandpass filter is designed to have a high transmittance for the light having a large incident angle and having a wavelength region (for example, peak wavelength) of the light emitted from the light emitting element, the bandpass filter has a high transmittance for light having a small incident angle and having a longer wavelength than that of the light emitting element.

In the following equation (1) indicative of an optical thickness of the dielectric layer of the bandpass filter, as an incident refraction angle $\theta_0$ becomes larger, the angle $\theta$ is also increased, which decreases the optical thickness. As a result, as the incident angle $\theta_0$ is increased, the bandpass filter has its optical characteristics shifted to shorter wavelength side.

$$\text{Optical thickness } d_{opt} = n \times d \times \cos\theta \quad (1)$$

where n is a refractive index of the dielectric layer on which the light is incident, d is a thickness of the dielectric layer on which the light is incident, and $\theta$ is a refraction angle of the light incident on the dielectric layer.

This means that in the wavelength region of the light emitting element, as the transmittance of the bandpass filter for the light in a region corresponding to a large incident angle is increased, for example, the transmittance for the light having a long wavelength, such as light emitted from the phosphor, is also increased.

The light from the phosphor passes through the bandpass filter 10 without being reflected by the filter 10, which seems to reduce the light emission efficiency of the light emitting device. As described above, however, most of light emitted from the phosphor reaches the upper surface of the bandpass filter 10 at a relatively high incident angle. As a result, the higher effect of the light emission of the light emitting element is caused by increasing the transmittance of the light in a wide range of incident angle exceeds the disadvantage due to the increasing of the light from the phosphor passing the through the bandpass filter, and the light emission efficiency of the entire light emitting device can be improved.

That is, conventionally, the bandpass filter is designed to have a higher transmittance for the light having the light emission wavelength of the light emitting element and to have a higher reflectivity for the light having the wavelength of a converted light by the phosphor, at an incident angle of 0°. The inventors of the present application have found out the following. The designing of the bandpass filter satisfying the above conditions results in insufficient transmittance in a range at a large incident angle for the light having a light emitting wavelength of the light emitting element. Even if the bandpass filter has a low reflectivity (or high transmittance) for a part of light (for example, on a short wavelength side and a low incident angle side) in a wavelength region of the converted light by the phosphor, the bandpass filter is designed to have the high transmittance for the light in a wide angle range from low to high incident angles within the wavelength range of the light emitted from the light emitting element. As a result, the bandpass filter can achieve the high light emission efficiency (light extraction efficiency) through the entire light emitting device.

The bandpass filter 10 with such characteristics can be obtained in various methods. For example, as will be described in detail later, the appropriate structure of the bandpass filter 10 can be determined by simulation.

There are a number of optical thin film design programs for simulating the optical characteristics of an optical multilayer film having a complicated structure. Among the programs, an appropriate one can be selected to calculate the optical characteristics of the bandpass filter. For example, Essential Macleod manufactured by Thin Film Center Inc. can be exemplified as one of such optical thin film design programs. The result of the simulation described in the present specification is obtained using the Essential Macleod.

Specifically, simulation is repeatedly performed until materials (refractive index) forming the multilayer film and the number of layers of the multilayer film are changed as parameters to find the appropriate conditions that cause the reflectivity (transmittance) at the desired incident angle and in the desired wavelength range to be within a predetermined corresponding range.

As described above, within the region at the light emitting wavelength of the light emitting element, the high transmittance can be obtained in a wide range from low to high incident angles. On the other hand, within the region at the wavelength of the light converted by the phosphor, for example, the reflectivity is allowed to be low in a part of the region at a low incident angle and a relatively short wavelength, and the reflectivity becomes high in a specific region, including a region at a high incident angle. The above conditions can be found by changing the parameters. Based on the findings, the structure of the bandpass filter 10 of the invention can be obtained.

Next, by such a method, the reflectivity of the bandpass filter is actually calculated by changing an incident angle and a wavelength.

Figure 4A:
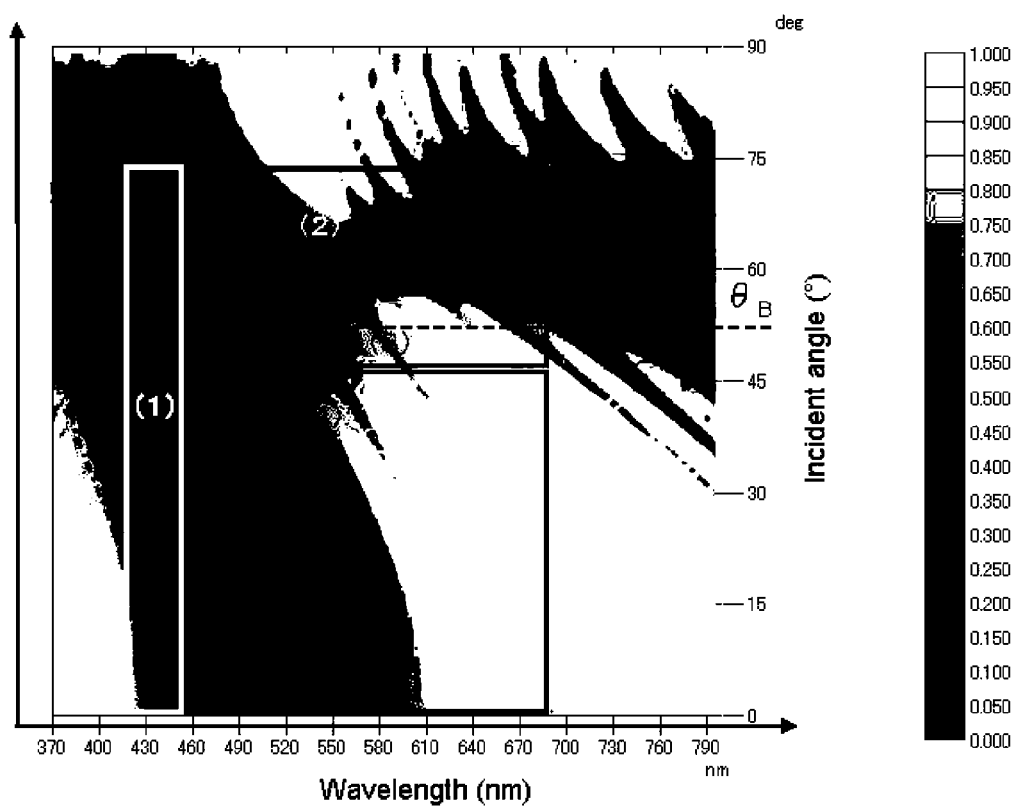
FIG. 4A is a graph exemplary showing the result of calculation of a reflectivity of the bandpass filter in the invention.
Figure 4B:
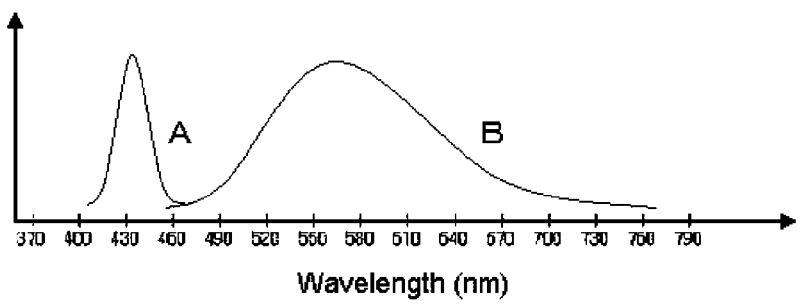
FIG. 4B is a schematic diagram showing a spectrum of a blue LED (see "A" of the drawing) as an example of a spectrum of the light emitting element, and a spectrum of a YAG phosphor (see "B" of the drawing) as an example of a spectrum of the phosphor.
Figure 5A:
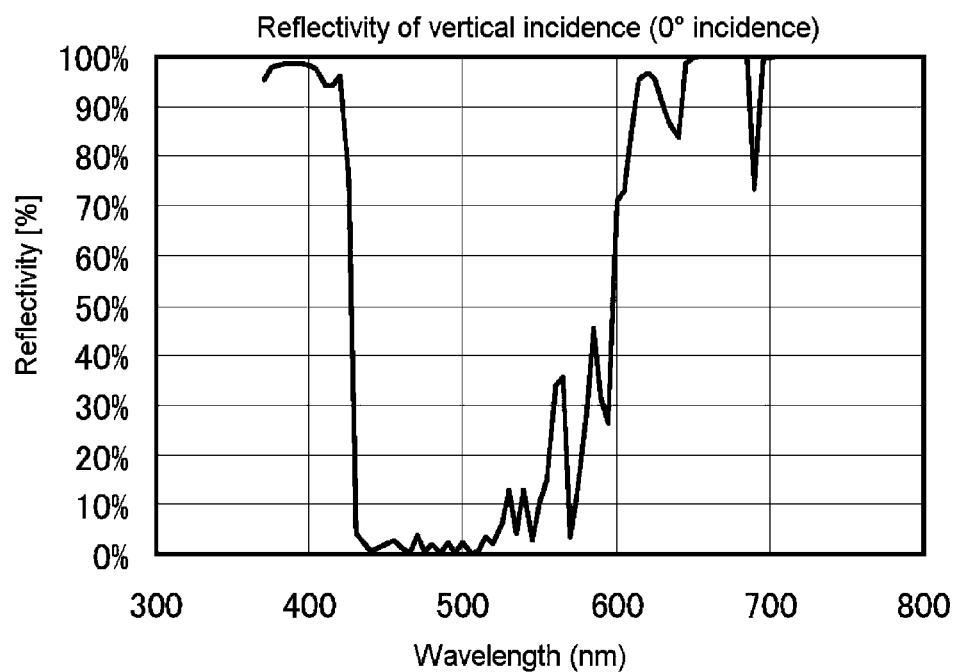
FIG. 5A is a graph showing a reflectivity at an incident angle of 0° in FIG. 4.
Figure 5B:
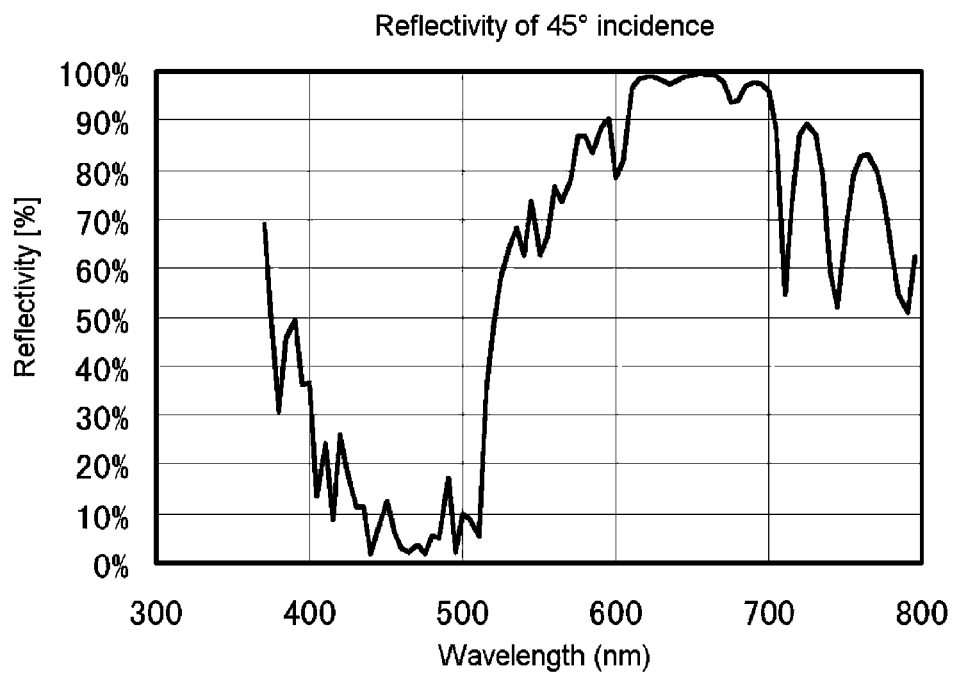
FIG. 5B is a graph showing a reflectivity at an incident angle of 45° in FIG. 4.
Figure 6A:
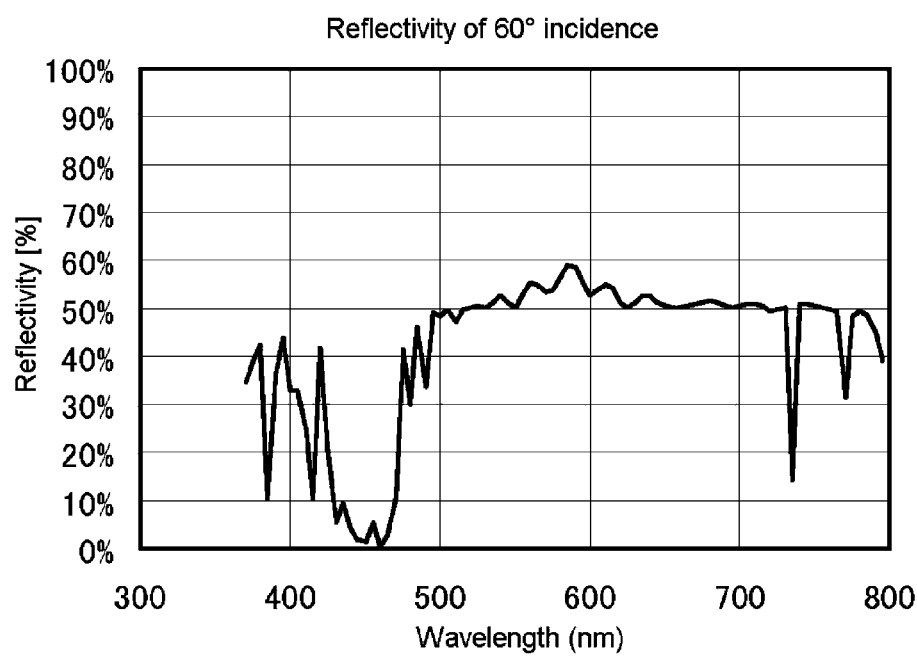
FIG. 6A is a graph showing a reflectivity at an incident angle of 60° in FIG. 4.
Figure 6B:
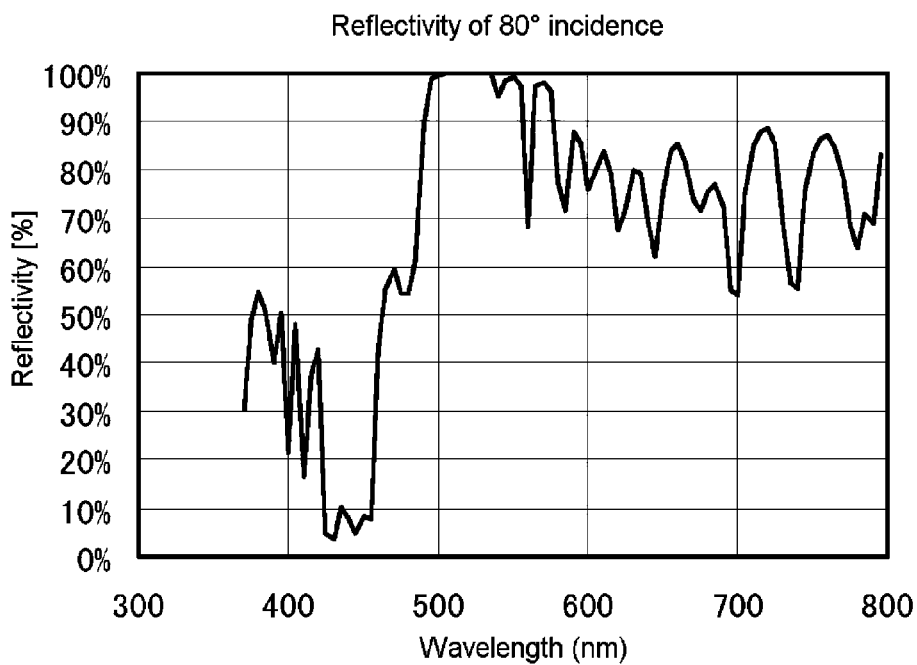
FIG. 6B is a graph showing a reflectivity at an incident angle of 80° in FIG. 4.
Figure 7:
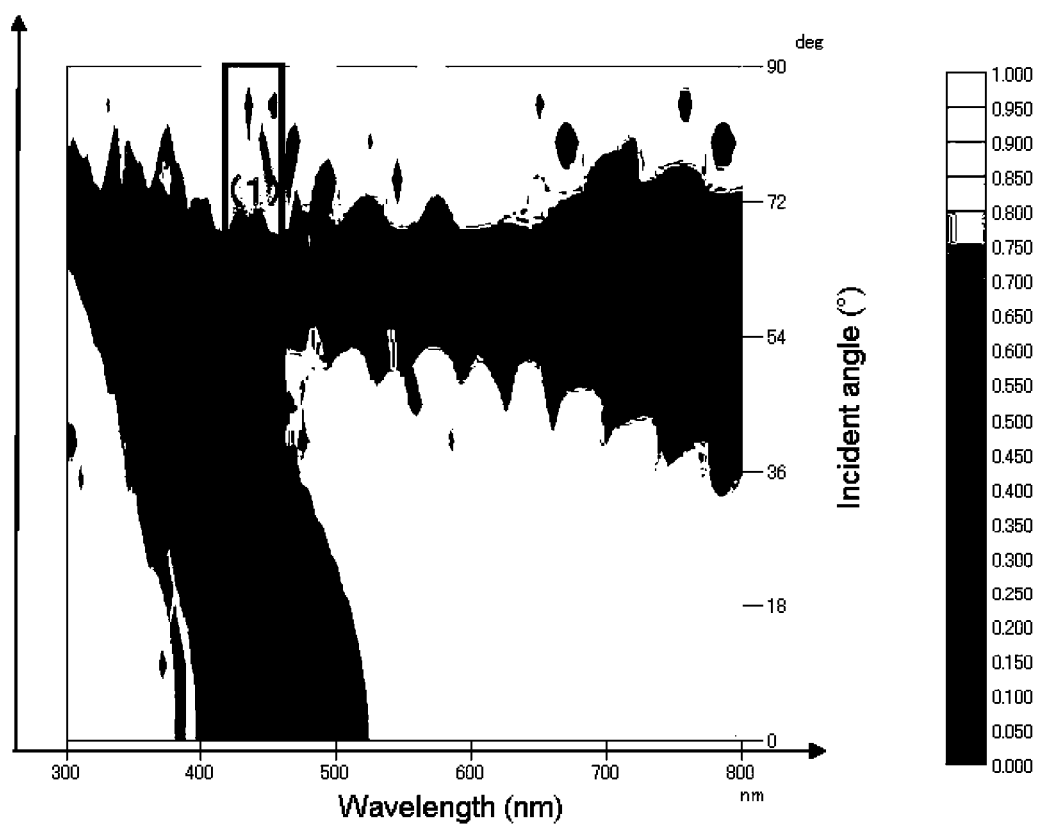
FIG. 7 is a graph showing the result of calculation of a reflectivity of a conventional bandpass filter.
Figure 8A:
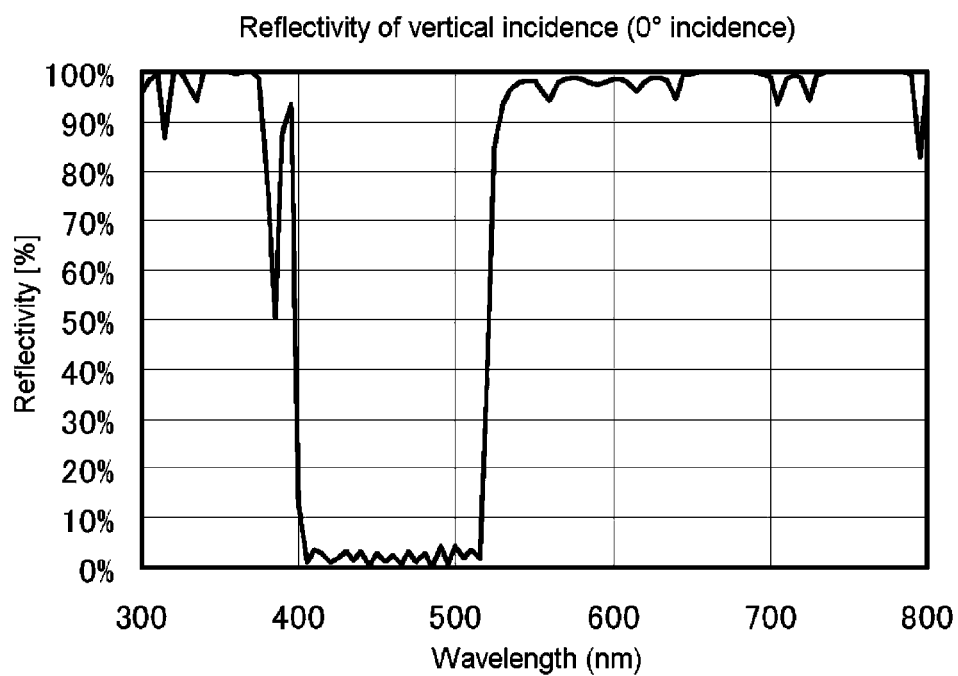
FIG. 8A is a graph showing a reflectivity at an incident angle of 0° in FIG. 7.
Figure 8B:
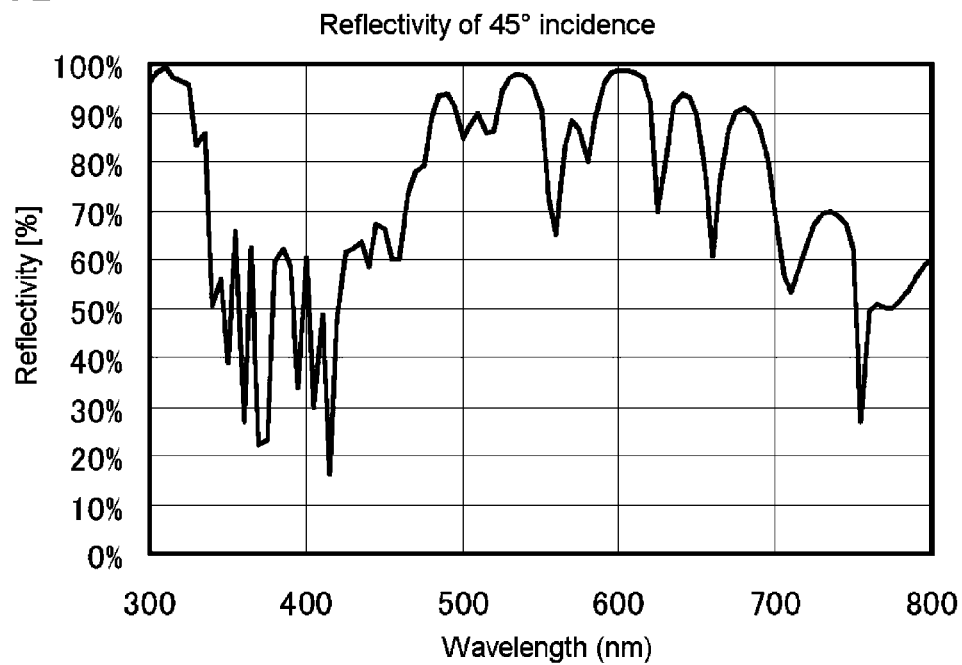
FIG. 8B is a graph showing a reflectivity at an incident angle of 45° in FIG. 7.
Figure 9A:
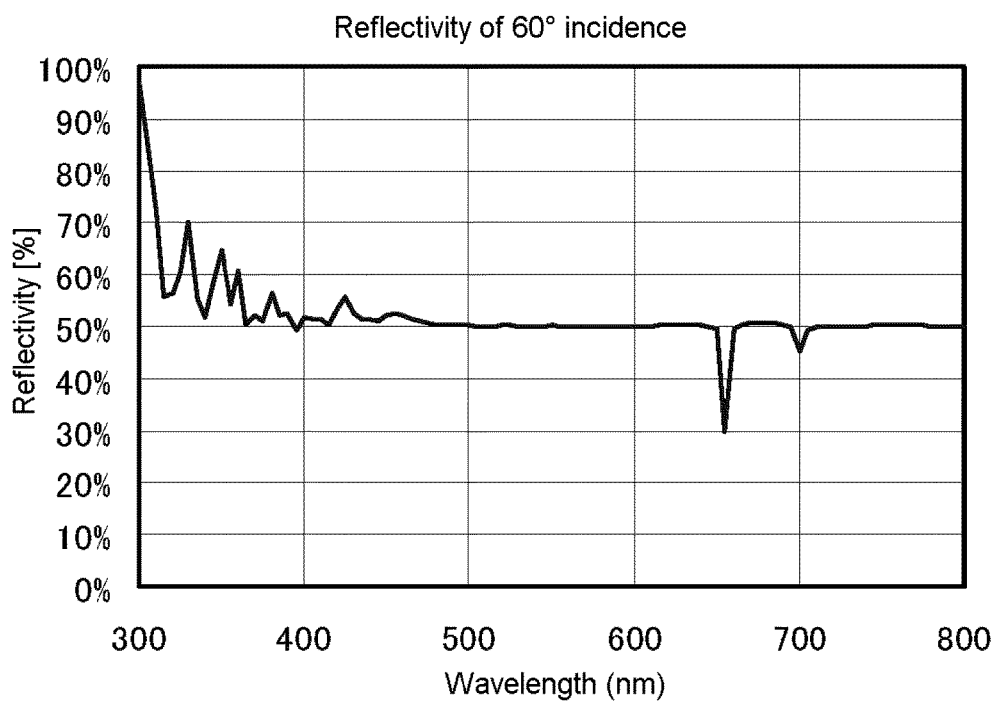
FIG. 9A is a graph showing a reflectivity at an incident angle of 60° in FIG. 7.
Figure 9B:
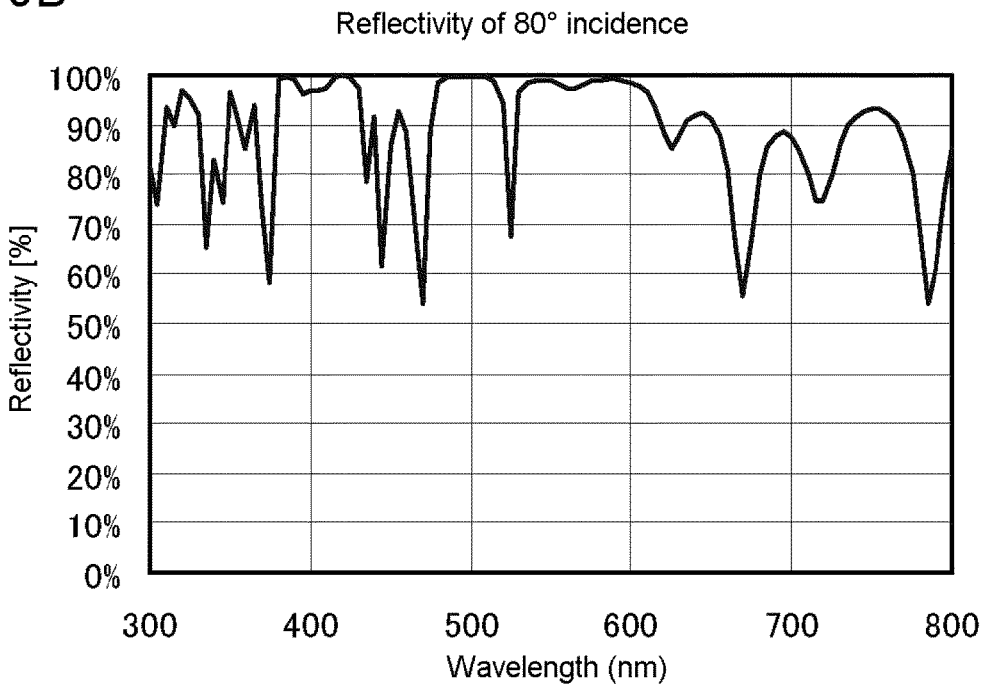
FIG. 9B is a graph showing a reflectivity at an incident angle of 80° in FIG. 7.

FIG. 4A is a graph showing the result of calculation of the reflectivity of the bandpass filter in the invention. FIG. 4B is a schematic diagram showing a spectrum of a blue LED (see "A" of the drawing) as an example of a spectrum of a light emitting element, and a spectrum of a YAG phosphor (see "B" of the drawing) as an example of a light emission spectrum of a phosphor. FIG. 5A is a graph showing a reflectivity at an incident angle of 0° in FIG. 4. FIG. 5B is a graph showing a reflectivity at an incident angle of 45° in FIG. 4. FIG. 6A is a graph showing a reflectivity at an incident angle of 60° in FIG. 4. FIG. 6B is a graph showing a reflectivity at an incident angle of 80° in FIG. 4. FIG. 7 is a graph showing the result of calculation of a reflectivity of a conventional bandpass filter. FIG. 8A is a graph showing a reflectivity at an incident angle of 0° in FIG. 7. FIG. 8B is a graph showing a reflectivity at an incident angle of 45° in FIG. 7. FIG. 9A is a graph showing a reflectivity at an incident angle of 60° in FIG. 7. FIG. 9B is a graph showing a reflectivity at an incident angle of 80° in FIG. 7.

FIG. 4A and FIGS. 5 to 9 show the result of calculation of the reflectivity, in which the sum of the reflectivity (%) and the transmittance (%) is 100% (because absorption can be negligible). Thus, the reflectivity (%) is subtracted from 100% to get the transmittance (%).

In FIGS. 4A and 7, a horizontal axis indicates a wavelength, and a longitudinal axis indicates an incident angle. For easy understanding of differences in reflectivity depending on the wavelength range and the incident angle range, the result of simulation is output in color. The accompanying drawings of the specification of the present application are represented in black and white. For easy and accurate understanding of the simulation result, the simulation result represented in color was filed as an evidence document. If necessary, the evidence document attached should also be referred to.

FIG. 4A shows the result of calculation of reflectivity of the bandpass filter 10 in one embodiment of the invention of the present application. In the bandpass filter 10, the first dielectric bodies 10A made of silicon oxide ($SiO_2$), and the second dielectric bodies 10B made of niobium pentoxide ($Nb_2O_5$) are stacked on each other in turn in 59 layers in total. On the other hand, in the conventional bandpass filter indicating the result of calculation shown in FIG. 7, the first dielectric bodies made of silicon oxide ($SiO_2$), and the second dielectric bodies made of niobium pentoxide (Nb$_2$O$_5$) are stacked on each other in turn in 49 layers in total. These materials hardly absorbs the light at a wavelength within a range of wavelength of 420 to 460 nm including a peak wavelength of the light emitting element, and the light at a wavelength of 520 to 580 nm, including a light emission peak wavelength of the phosphor. In this way, preferably, the material that hardly absorbs the light at the peak wavelength of the light emitting element 6, and the light having at least one kind of light emitting peak wavelength of the phosphor contained in the phosphor-containing layer is selected as the material for the bandpass filter, the light emission efficiency of the light emitting device 100 can be advantageously increased.

Although the material for absorbing these lights (for example, at an absorption ratio of several to several tens of %) may be used to form the bandpass filter 10, the light passing through the bandpass filter 10 and/or light reflected by the bandpass filter 10 is reduced by the amount of light absorbed in the material.

FIG. 10 shows a table of the thickness of each layer of the bandpass filter in the invention of the present application. The thickness shown in FIG. 10 was used to obtain the result of calculation shown in FIG. 4A. FIG. 11 shows a table showing the thickness of each layer of the conventional bandpass filter. The thickness shown in FIG. 11 was used to obtain the result of calculation shown in FIG. 7.

Referring to FIGS. 10 and 11, the number No. 1 indicates a superficial layer of the bandpass filter on the phosphor-containing layer 12 side (on the upper surface side of the bandpass filter). The respective layers are arranged downward in the order of increasing the number. The layer having the largest number (layer 59 shown in FIG. 10, layer 49 shown in FIG. 11) is a superficial layer of the bandpass filter on the contact layer 8 side (light emitting element 6 side).

As can be seen from FIG. 10, in the bandpass filter 10 indicating the simulation result shown in FIG. 4A, the thickness of the first layer (layer indicated by No. 1 of FIG. 10) on the phosphor-containing layer 12 side is larger than that of any one of other layers. In this way, the first layer of the bandpass filter 10 on the phosphor-containing layer 12 side is larger than that of other layers. As a result, among all lights emitted from the light emitting element 6 to enter the phosphor-containing layer 12 through the bandpass filter 10, a total reflection angle can be set for the light returning toward the bandpass filter 10. This arrangement allows the light incident on the surface of the band pass filter 10 having an incident angle of the into surely reflect again at an angle of the total reflection angle or more to reflected surely and return to the phosphor-containing layer 12 side, and thus this arrangement is preferable. The first layer on the phosphor-containing layer 12 may be formed of a material different from materials forming other layers as long as a refractive index of the first layer is lower than that of the phosphor-containing layer 12.

A multilayer film was designed by using a refractive index of the first dielectric layer (SiO$_2$) of 1.48 and refractive index of the second dielectric layer (Nb$_2$O$_5$) of 2.38, so that an appropriate film structure, having a high transmittance for the light with a wavelength of 425 to 500 nm at an incident angle of 0 to 45° (at intervals of) 15° and at an incident angle of 60 to 80° (at intervals of 10°), as well as having a high reflectivity for the light with a wavelength of 550 to 700 nm at an incident angle in range of 0 to 45° (at intervals of 15°) and in range of 60 to 80° (at intervals of 10°) (especially on higher angle of both ranges), is obtained.

FIGS. 5A and 8A show the reflectivity at an incident angle of 0°. In comparison between FIG. 5A and FIG. 8A, the bandpass filter 10 of the invention shown in FIG. 5A has a reflectivity of about 0 to 3% at a peak wavelength of a blue LED of about 445 nm indicated by the spectrum A shown in FIG. 4B, and a reflectivity of about 10 to 20% at a peak wavelength of a YAG phosphor of about 555 nm indicated by the spectrum B shown in FIG. 4B. On the other hand, the conventional bandpass filter shown in FIG. 8A has a reflectivity of about 0 to 3% at a wavelength of about 445 nm, and a reflectivity of about 95 to 97% at a wavelength of about 555 nm. Only from this fact, the conventional bandpass filter having the high reflectivity at a wavelength of about 555 nm seems to be superior to the bandpass filter of the invention.

However, as can be seen from FIGS. 4A, 5A, 5B, 6A, and 6B, the bandpass filter 10 of the invention has a maximum reflectivity of 40% or less (that is, a transmittance of 60% or more) at a wavelength of 445 nm at an incident angle in a range of 0 to 85°. The bandpass filter 10 has a reflectivity of 10% or less (transmittance of 90% or more) in most of the range of incident angle of 0 to 85° (in at least 80% or more of the range of the incident angle of 0 to 85°).

The term "incident angle of 0 to 85°" means the entire angle range for the practical use because at an incident angle exceeding 85°, the light is substantially horizontally incident on the surface, causing an inevitable decrease in transmittance.

In contrast, in the conventional bandpass filter having a reflectivity shown in FIG. 7, as can be seen from FIGS. 7, 9A, and 9B, the reflectivity is 50% or more (transmittance is 50% or less) at an incident angle exceeding 50°. The reflectivity is about 80% or more (transmittance is 20% or less) at an incident angle of 70° or more.

As can be seen from the above results, the bandpass filter 10 of the invention is obviously superior to the conventional bandpass filter.

However, in the embodiment shown in FIG. 4A, in the region indicated by the "(1)" of FIG. 4A, that is, in a range of wavelength of 420 to 460 nm, in a range of the incident angles of 0 to 85°, the maximum reflectivity is 40% or less (that is, the transmittance is 60% or more), and in most of the range of incident angle of 0 to 85° (in at least 80% or more of a range of incident angles of 0 to 85° (based on an area ratio of the region (1) to all area)), the reflectivity is 10% or less (transmittance is 90% or more). That is, this substantially covers most of the general wavelength range of the blue LED peak, in other words, substantially covers the wavelength range in which the strength of the spectrum of the general blue LED is high.

FIG. 4A shows the case of using the blue LED as the light emitting element. For example, the above simulation can be performed on any light emitting element other than a blue LED, such as an ultraviolet ray LED, or a green LED, which can result in the maximum reflectivity of 40% or less (transmittance of 60% or more) in a range of incident angle of 0 to 85°, and in reflectivity of 10% or less (transmittance of 90% or more) in most of a range of incident angle of 0 to 85° (in at least 80% or more of the range of incident angle of 0 to 85°) at a peak wavelength of the light emitting element.

An average transmittance can be used as an index for evaluating the entire region, like the region (1). The average transmittance is the index indicative of the transmittance in a specific wavelength range and in the entire range of incident angles, for example, like the region (1). The average transmittance can be determined by averaging the transmittances in the above range by simulation. In the actual bandpass filter, the transmittance can be measured and determined by a spectrophotometer (for example, spectrophotometer V-550 and ARM-500V manufactured by JASCO Corporation).

In one of the preferred embodiment in use of the average transmittance, in the light emitting spectrum of the light emitting element 6, the bandpass filter 10 has an average transmittance of 80% or more, preferably 90% or more, and more preferably 95% or more in a range of incident angles of 0 to 75° (preferably, 0 to 80°, and more preferably 0 to 90°) within a range of wavelengths at which the strength of light emission is 20% or more (preferably 5% or more, and more preferably 1% or more) of the peak strength.

The bandpass filter 10 of one embodiment of the invention has a reflectivity of 40% or less (that is, transmittance of 60% or more) at a wavelength of about 555 nm in a range of incident angles of 0 to 30°. In the region having an incident angle of about 30° or more, that is, in the region with much amount of light, there is not a large difference in reflectivity (transmittance) between the bandpass filter 10 of one embodiment of the invention of the present application and the conventional bandpass filter, and both the reflectivities of the bandpass filter of the one embodiment of the invention and the conventional bandpass filter are at least 50% or more. In most of the range of incident angles of 70° or more (in the range of incident angles of 70° or more, at least 80% or more), the reflectivity of each of the bandpass filters is 95% or more (transmittance is 5% or less).

Next, a reflectivity (transmittance) near a Brewster's angle will be described below.

The Brewster's angle $\theta_B$ can be determined from the following equation (2):

$$\theta_B = \text{Arctan}(n_2/n_1) \tag{2}$$

where $n_1$ is a refractive index of the contact layer 8 (layer in contact with the incident side surface of the bandpass filter 10), and $n_2$ is refractive index of a phosphor-containing layer 12 (layer in contact with the emission side surface of the bandpass filter 10).

In the light emitting device 100 shown in FIG. 1, the contact layer 8 is a layer in contact with the incident side (light emitting element side) surface of the bandpass filter 10. In the light emitting device without having the contact layer 8, the layer that is in contact with the incident side surface of the bandpass filter 10 is the layer other than the contact layer, for example, the substrate of the light emitting element (sapphire substrate, gallium nitride substrate, or the like).

The incident angle of 53° indicated by a dotted line in FIG. 4A is the Brewster's angle $\theta_B$ of the bandpass filter 10 according to the embodiment of FIG. 4A.

The Brewster's angle $\theta_B$ is an incident angle at which the light reflected at an interface between layers with different refractive indexes completely becomes polarized light. When the light is incident on the interface between two layers (dielectric layers) with different refractive indexes, P polarized light which is a polarized component parallel to the incident surface (surface of the layer) and S polarized light which is a polarized component vertical to the incident surface (surface of the layer) differ from each other in reflectivity. When the incident angle of P polarized light is same as the Brewster's angle $\theta_B$, the reflectivity of the P polarized light becomes 0% (transmittance of 100%), and it increases as the incident angle increases. On the other hand, reflectively of the S polarized light is simply increased as the incident angle increases.

That is, when the incident angle is the Brewster's angle $\theta_B$, all the P polarized light passes and only the S polarized light contributes to the reflection, which results in maximum reflectivity of 50% (transmittance of at least 50%).

Figure 12A:
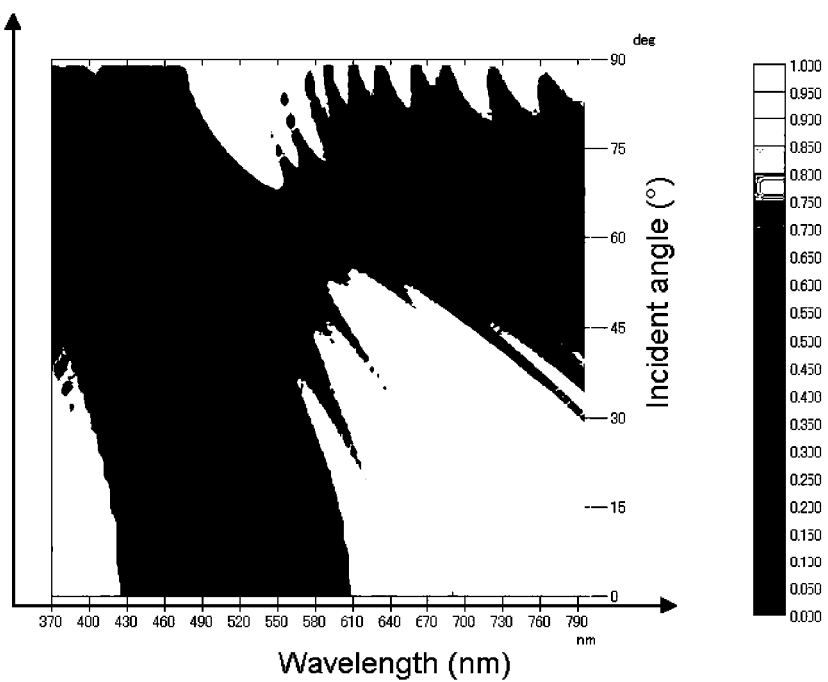
FIG. 12A is a diagram of the reflectivities of the bandpass filter 10 shown in FIG. 4A in the cases of the P polarization and S polarization, and shows the reflectivity of the P polarization
Figure 12B:
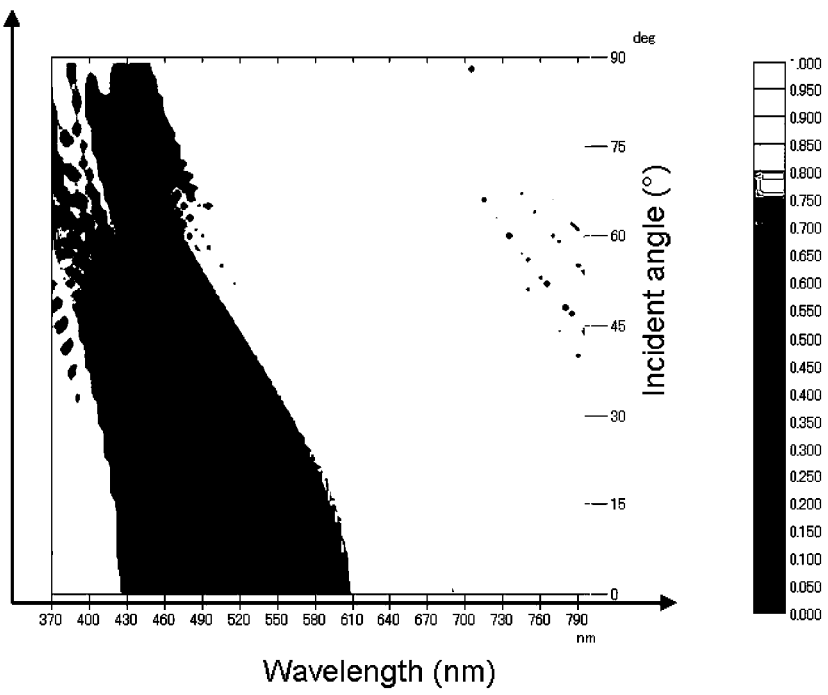
FIG. 12B shows the reflectivity of the S polarization.

FIGS. 12A and 12B are diagrams of the reflectivities of the bandpass filter 10 shown in FIG. 4A in the cases of the P polarization and S polarization, in which FIG. 12A shows the reflectivity of the P polarization and FIG. 12B shows the reflectivity of the S polarization.

In the embodiment shown in FIG. 12, as can be seen from FIG. 12A, the P polarized light has a transmittance of about 95% or more within plus or minus 5° from the Brewster's angle across the entire range of wavelengths (370 to 790 nm). On the other hand, the S polarized light has a reflectivity of 95% or more not only at the peak wavelength of most phosphors, such as a YAG phosphor, but also in a range of wavelengths of 490 to 790 nm covering the spectrum range of the light emission and in most of the range of plus or minus 5° from the Brewster's angle.

Taking into consideration the existence of the Brewster's angle $\theta_B$, FIG. 4A shows the regions (2), (3), and (4).

The region (2) has a wavelength range of about 490 to 690 nm corresponding to the range of the light emission spectrum of the YAG phosphor, and a range of incident angles corresponds to a Brewster's angle $\theta_B+5$ to 90°. In most of the range, the reflectivity is 90% or more (transmission is 10% or less) and in all the range, the reflectivity is 60% or more (transmission is 40% or less).

This means that the bandpass filter 10 has a transmittance of 40% or less for the light having a peak wavelength of the light emitted from at least one of the phosphors included in the phosphor-containing layer 12 (for example, a light emission peak wavelength of 520 to 580 nm in use of the YAG phosphor) at an incident angle of the Brewster's angle $\theta_B+5$ to 85°.

A preferred embodiment of a region similar to the region (2) will be described below.

The bandpass filter of one embodiment of the invention can preferably have an average reflectivity of 50% or more, preferably 70% or more, and more preferably 90% or more at an incident angle of $\theta_B+(90°-\theta_B)/2$ to 90°, preferably, $\theta_B+(90°-\theta_B)/4$ to 90°, and more preferably $\theta_B+(90°-\theta_B)/8$ to 90°, within the range of wavelengths that sets the spectrum intensity of at least one kind of light from the phosphors contained in the phosphor-containing layer 12, to 20% or more of the peak intensity (preferably 5% or more, and more specifically, 1% or more).

Next, the region (3) shown in FIG. 4A will be described below.

The region (3) has a wavelength range of about 490 to 690 nm corresponding to the range of the light emission spectrum of the YAG phosphor, and the range of incident angles corresponds to the $\theta_B-5°$ to $\theta_B+5°$. The reflectivity in most of the range of incident angles is 40 to 50% (transmittance of 50 to 60%). As mentioned above, at the Bewster's angle $\theta_B$, the P polarized light is not reflected. The above-mentioned reflectivity can be obtained based on the reflection of the S polarized light. That is, as can be seen from FIG. 10B, the reflectivity of the S polarized light in most of the region (3) is equal to or more than 90%.

When the incident angle is equal to the Brewster's angle $\theta_B$ in the region (3), the bandpass filter 10 can have a reflectivity of 40% or more (transmission of 60% or less). When the incident angle is equal to the Brewster's angle $\theta_B$ in the region (3), the reflectivity of the S polarized light can be 80% or more (transmittance of 20% or less), and preferably 90% or more (transmittance of 10% or less).

The bandpass filter 10 can have a transmittance of 60% or less (reflectivity of 40% or more) for the light having a peak wavelength of the light emitted from at least one of the phosphors included in the phosphor-containing layer 12 (for example, a light emission peak wavelength of 520 to 580 nm in use of the YAG phosphor) when the incident angle is the same as the Brewster's angle $\theta_B$.

A preferred embodiment of a region similar to the region (3) will be described below.

The bandpass filter of the invention can preferably have an average reflectivity of the S polarized light of 50% or more, preferably 70% or more, and more preferably 90% or more at an incident angle of $\theta_B \pm (90°-\theta_B)/2$, preferably, $\theta_B \pm (90°-\theta_B)/4$, and more preferably $\theta_B \pm (90°-\theta_B)/8$ within a range of wavelengths at which the spectrum intensity of the light from at least one of the phosphors contained in the phosphor-containing layer 12 is 20% or more of the peak intensity (preferably 5% or more, and more specifically, 1% or more).

Next, the region (4) shown in FIG. 4A will be described below.

The region (4) has its wavelength range from 490 to 690 nm which corresponds to the range of light emission spectra of the YAG phosphor. The region (4) is a region which has a high reflectivity, for example, of 50% or more (transmittance of 50% or less) even at the low incident angle of less than $\theta_B-5°$ (which corresponds to a region excluding a region lower than right dashed-dotted line in the drawing).

That is, the bandpass filter 10 can have a reflectivity of 50% or more (transmittance of 50% or less) for the light having the peak wavelength of the light emitted from at least one kind of the phosphors contained in the phosphor-containing layer 12 (for example, the peak wavelength of light emission of the YAG phosphor being in a range of 520 to 580 nm) at an incident angle of 45° to $\theta_B-5°$, preferably, 30° to $\theta_B-5°$, and more preferably, 20° to $\theta_B-5°$.

The bandpass filter 10 can have a reflectivity of 65% or more (transmittance of 35% or less), preferably, a reflectivity of 75% or more (transmittance of 25% or less), and more preferably a reflectivity of 80% or more (transmittance of 20% or less) for the light having the peak wavelength of the light emitted from at least one kind of the phosphors contained in the phosphor-containing layer 12 (for example, the peak wavelength of light emission of the YAG phosphor being in a range of 520 to 580 nm) at an incident angle away from the Bewster's angle $\theta_B$, for example, one or more of incident angles of 20°, 30° and 40°.

A preferred embodiment of a region similar to the region (4) will be described below.

The bandpass filter of one embodiment of the invention can preferably have an average reflectivity of 50% or more, preferably 70% or more, and more preferably 90% or more at an incident angle of $\theta_B$ to $\theta_B/2$, preferably, $\theta_B$—$\theta_B/4$, and more preferably $\theta_B$ to $\theta_B/8$ within the range of wavelengths at which the spectrum intensity of the light from at least one of the phosphors contained in the phosphor-containing layer 12 is 20% or more of the peak intensity (preferably 5% or more, and more specifically, 1% or more).

(3) Light Emitting Element

The light emitting element 6 may be a semiconductor element, such as a light emitting diode (LED), that spontaneously ignites by application of a voltage.

A surface-mounted LED is preferably used as the light emitting element 6. The light emitting element 6 can be selected to have any light emission wavelength depending on applications of the light emitting device 100. For example, the light emitting element 6 of a blue (light having a wavelength of 430 to 490 nm) or green (light having a wavelength of 490 to 590 nm) can be formed using a nitride semiconductor ($In_xAl_yGa_{1-X-Y}N$, $0 \leq X$, $0 \leq Y$, $X+Y \leq 1$).

In the invention, the phosphor-containing layer 12 contains at least one kind of phosphor, and thus a nitride semiconductor ($In_xAl_yGa_{1-X-Y}N$, $0 \leq X$, $0 \leq Y$, $X+Y \leq 1$) that can emit light with a short wavelength for effectively exciting the phosphors is preferably use for the light emitting element 6. For example, the blue LED is preferably used as the light emitting element 6. The component composition and light emission of the light emitting element 6 are not limited to those described above, and can be appropriately selected according to the purpose. The light emitting element 6 may be an element that outputs not only the visible light, but also ultraviolet rays.

(4) Phosphor

The phosphor contained in the phosphor-containing layer 12 may be any kind of phosphor.

For example, a nitride phosphor mainly activated by lanthanoid elements, such as Eu or Ce, can be used as the above phosphor.

The red phosphors for use can include, for example, a SCASN phosphor, such as (Sr, Ca) $AlSiN_3$:Eu, a CASN phosphor, such as $CaAlSiN_3$:Eu, $Ca_2Si_5N_8$:Eu, $SrAlSiN_3$:Eu, and α-SiAlON phosphor activated by Eu.

The yellow phosphor for use can be, for example, yttrium aluminum garnet phosphor (YAG phosphor). For example, a part or all of Y may be substituted by Tb or Lu in the YAG phosphor. Specifically, the YAG phosphor may be $Tb_3Al_5O_{12}$:Ce, or $Lu_3Al_5O_{12}$:Ce. Further, another phosphor having the similar performance, operation, and effect as those of the above phosphors can also be used. The phosphor may be made of silicate phosphor activated by Eu.

The use of the YAG phosphor can improve the high color rendering properties of light emission of the light emitting device 100. Thus, the invention preferably uses the YAG phosphor.

The YAG phosphor may be contained in the phosphor-containing layer 12 in any arbitrary form. In one of the preferred embodiments, the so-called YAG glass is used as the phosphor-containing layer 12. Likewise, another phosphor other than the YAG phosphor, such as a red phosphor or a green phosphor, may be contained in the phosphor-containing layer 12 in the arbitrary form. In one of the preferred embodiments, the phosphor is included in glass (phosphor-containing glass is formed).

The green phosphor for use can be, for example, a chlorosulfate phosphor, such as $Ca_8MgSi_4O_{16}Cl_2$:Eu, or a β-SiAlON phosphor, such as $Si_{6-Z}Al_ZO_ZN_{8-Z}$:Eu.

For example, an oxynitride phosphor mainly activated by lanthanoid elements, such as Eu or Ce, can also be used as another phosphor.

The term "red phosphor" as used in the specification of the present application means a phosphor that absorbs and converts the light into another light having a peak wavelength in a range of 580 to 800 nm. The term "green phosphor" as used herein means a phosphor having a peak wavelength in a range of 490 to 570 nm. The term "yellow phosphor" as used herein means a phosphor having a peak wavelength in a range of 510 to 580 nm.

Actually, the bandpass filters were formed and its light emission efficiency of each filter was evaluated.

As a sample example, the light emitting device 100 including the bandpass filter 10 with the laminated structure illustrated in FIG. 10 was obtained as shown in FIG. 1. A sample 1 of a comparative example can provide a light emitting device without having a bandpass filter 10 and which has the same structure as that of the sample example except for the bandpass filter. A sample 2 of another comparative example can provide a light emitting device including a bandpass filter with a laminated structure shown in FIG. 11, instead of the bandpass filter 10, and which has the same structure as that of the sample example except for the bandpass filter.

As to each of the sample example, and the samples 1 and 2 of the comparative example, the light extraction efficiency of each sample was measured using an integrating sphere method.

As a result, the sample example has improved light extraction efficiency by 3.7% as compared to the sample 1 of the comparative example. The sample 2 of the comparative example has reduced light extraction efficiency by 13% as compared to the sample 1 of the comparative sample 1.

CROSS REFERENCE TO RELATED PATENT APPLICATION

This application claims priority under the Paris Convention on Japanese Patent Application No. 2012-28772271996 filed on Dec. 28, 2012, the content of which is incorporated by reference herein.

What is claimed is:

1. A light emitting device, comprising:
a substrate;
a resin package disposed on the substrate, the resin package comprising a light-reflective resin;
a light emitting element that is laterally surrounded by the resin package such that the resin package contacts lateral surfaces of the light emitting element;
a phosphor-containing layer containing at least one kind of phosphor; and
a bandpass filter disposed between the phosphor-containing layer and the light emitting element, wherein the bandpass filter is laterally surrounded by the resin package such that the resin package contacts lateral surfaces of the bandpass filter, and wherein the bandpass filter comprises a multilayer film including a plurality of first and second dielectric layers, the second dielectric layer being disposed over the first dielectric layer,
wherein the bandpass filter has a transmittance of 60% or more for light having a light emission peak wavelength of the light emitting element at an incident angle in a range of 0 to 85°, and
wherein the bandpass filter has a transmittance of 40% or less for light having a light emission peak wavelength of the at least one kind of phosphor at an incident angle in a range of a Brewster's angle ($\theta_b$) of the bandpass filter +5°($\theta_b$ +5°) to 85°.

2. The light emitting device according to claim 1, wherein the bandpass filter has a transmittance of 60% or less for light having a light emission peak wavelength of the at least one kind of phosphor at an incident angle that is the same angle as the Brewster's angle ($\theta_b$) of the bandpass filter.

3. The light emitting device according to claim 1, wherein the bandpass filter has a transmittance of 50% or less for light having a light emission peak wavelength of the at least one kind of phosphor at an incident angle in a range of a Brewster's angle ($\theta_b$) of the bandpass filter −5°($\theta_b$ −5°) to 45°.

4. The light emitting device according to claim 2, wherein the bandpass filter has a transmittance of 50% or less for light having a light emission peak wavelength of the at least one kind of phosphor at an incident angle in a range of a Brewster's angle ($\theta_b$) of the bandpass filter −5°($\theta_b$−5°) to 45°.

5. The light emitting device according to claim 1, wherein the light emitting element is a blue light emitting diode.

6. The light emitting device according to claim 4, wherein the light emitting element is a blue light emitting diode.

7. The light emitting device according to claim 1, wherein at least one kind of the phosphor is an yttrium aluminum garnet phosphor.

8. The light emitting device according to claim 4, wherein at least one kind of the phosphor is an yttrium aluminum garnet phosphor.

9. The light emitting device according to claim 6, wherein at least one kind of the phosphor is an yttrium aluminum garnet phosphor.

10. The light emitting device according to claim 1, wherein a thickness of a first layer of the bandpass filter, on a phosphor side of the multilayer film, is larger than that of each of other layers of the multilayer film.

11. The light emitting device according to claim 2, wherein a thickness of a first layer of the bandpass filter, on a phosphor side of the multilayer film, is larger than that of each of other layers of the multilayer film.

12. The light emitting device according to claim 3, wherein a thickness of a first layer of the bandpass filter, on a phosphor side of the multilayer film, is larger than that of each of other layers of the multilayer film.

13. The light emitting device according to claim 4, wherein a thickness of a first layer of the bandpass filter, on a phosphor side of the multilayer film, is larger than that of each of other layers of the multilayer film.

14. The light emitting device according to claim 6, wherein wherein a thickness of a first layer of the bandpass filter, on a phosphor side of the multilayer film, is larger than that of each of other layers of the multilayer film.

15. The light emitting device according to claim 8, wherein wherein a thickness of a first layer of the bandpass filter, on a phosphor side of the multilayer film, is larger than that of each of other layers of the multilayer film.

16. The light emitting device according to claim 9, wherein wherein a thickness of a first layer of the bandpass filter, on a phosphor side of the multilayer film, is larger than that of each of other layers of the multilayer film.

17. The light emitting device according to claim 10, wherein the bandpass filter has a transmittance of 60% or less for light having a wavelength in a range of 520 to 580 nm at an incident angle that is the same as the Brewster's angle ($\theta_b$).

18. The light emitting device according to claim 6, wherein the bandpass filter has a transmittance of 50% or less for light having a wavelength in a range of 520 to 580 nm at an incident angle in a range of the Brewster's angle ($\theta_b$) −5°($\theta_b$ −5°) to 45°.

19. The light emitting device according to claim 1, further comprises a contact layer disposed between the bandpass filter and the light emitting element.

20. The light emitting device according to claim 19, wherein the contact layer is thinner than the bandpass filter.

21. The light emitting device according to claim 19, wherein the contact layer is laterally surrounded by the resin package such that the resin package contacts side surfaces of the contact layer.

* * * * *